(12) United States Patent
Byl et al.

(10) Patent No.: US 10,109,488 B2
(45) Date of Patent: Oct. 23, 2018

(54) PHOSPHORUS OR ARSENIC ION IMPLANTATION UTILIZING ENHANCED SOURCE TECHNIQUES

(71) Applicant: Entegris, Inc., Billerica, MA (US)

(72) Inventors: Oleg Byl, Southbury, CT (US); Sharad N. Yedave, Danbury, CT (US); Joseph D. Sweeney, New Milford, CT (US); Barry Lewis Chambers, Midlothian, VA (US); Ying Tang, Brookfield, CT (US)

(73) Assignee: Entegris, Inc., Billerica, MA (US)

( * ) Notice: Subject to any disclaimer, the term of this patent is extended or adjusted under 35 U.S.C. 154(b) by 0 days.

(21) Appl. No.: 15/507,859

(22) PCT Filed: Aug. 19, 2015

(86) PCT No.: PCT/US2015/045973
§ 371 (c)(1),
(2) Date: Mar. 1, 2017

(87) PCT Pub. No.: WO2016/036512
PCT Pub. Date: Mar. 10, 2016

(65) Prior Publication Data
US 2017/0250084 A1    Aug. 31, 2017

Related U.S. Application Data

(60) Provisional application No. 62/044,409, filed on Sep. 1, 2014.

(51) Int. Cl.
*H01J 37/00* (2006.01)
*H01L 21/265* (2006.01)
(Continued)

(52) U.S. Cl.
CPC .......... *H01L 21/2658* (2013.01); *H01J 37/08* (2013.01); *H01J 37/244* (2013.01);
(Continued)

(58) Field of Classification Search
None
See application file for complete search history.

(56) References Cited

U.S. PATENT DOCUMENTS

| 7,138,768 B2 | 11/2006 | Maciejowski et al. |
| 2005/0202657 A1 | 9/2005 | Borland et al. |

(Continued)

FOREIGN PATENT DOCUMENTS

| CN | 103153858 A | 6/2013 |
| JP | 07-262961 A | 10/1995 |

(Continued)

*Primary Examiner* — Charles Garber
*Assistant Examiner* — Alia Sabur
(74) *Attorney, Agent, or Firm* — Entegris, Inc.

(57) ABSTRACT

Apparatus and method for use of solid dopant phosphorus and arsenic sources and higher order phosphorus or arsenic implant source material are described. In various implementations, solid phosphorus-comprising or arsenic-comprising materials are provided in the ion source chamber for generation of dimer or tetramer implant species. In other implementations, the ion implantation is augmented by use of a reactor for decomposing gaseous phosphorus-comprising or arsenic-comprising materials to form gas phase dimers and tetramers for ion implantation.

19 Claims, 5 Drawing Sheets

(51) Int. Cl.
*H01J 37/08* (2006.01)
*H01J 37/317* (2006.01)
*H01J 37/244* (2006.01)
*H01L 31/18* (2006.01)

(52) U.S. Cl.
CPC .......... *H01J 37/3171* (2013.01); *H01L 31/18* (2013.01); *H01J 2237/006* (2013.01); *H05K 999/99* (2013.01)

(56) References Cited

U.S. PATENT DOCUMENTS

| | | | |
|---|---|---|---|
| 2008/0087219 A1 | 4/2008 | Horsky | |
| 2009/0183679 A1* | 7/2009 | McIntyre | H01J 37/08 118/723 CB |
| 2011/0065268 A1* | 3/2011 | Olander | H01J 37/08 438/515 |
| 2012/0252195 A1* | 10/2012 | Jones | H01J 37/08 438/514 |

FOREIGN PATENT DOCUMENTS

| | | | |
|---|---|---|---|
| WO | WO 2012129454 A2 * | 9/2012 | .......... H01J 37/3171 |
| WO | 2013/068796 A2 | 5/2013 | |
| WO | 2016/036512 A1 | 3/2016 | |

\* cited by examiner

PHOSPHORUS OR ARSENIC ION IMPLANTATION UTILIZING ENHANCED SOURCE TECHNIQUES

CROSS-REFERENCE TO RELATED APPLICATION

The benefit of priority under 35 USC 119 of U.S. Provisional Patent Application No. 62/044,409 filed Sep. 1, 2014 in the names of Oleg Byl, et al. for "PHOSPHORUS OR ARSENIC ION IMPLANTATION UTILIZING ENHANCED SOURCE TECHNIQUES" is hereby claimed. The disclosure of U.S. Provisional Patent Application No. 62/044,409 is hereby incorporated herein by reference, in its entirety, for all purposes.

FIELD

The present disclosure relates to ion implantation of phosphorus or arsenic. More specifically, the disclosure relates to enhanced source techniques for use of solid dopant sources and higher order phosphorus or arsenic implant source material, and to associated methods and apparatus.

In specific aspects, the disclosure relates to formation of As and P cluster molecules, including dimers and tetramers, for generation of corresponding phosphorus and arsenic cluster ions, including dimers and tetramers. The disclosure further relates to the use of gas mixtures to extend source life, e.g., gas mixtures such as (i) $PH_3$ and $PF_3$, (ii) $PH_3$ and $PF_5$, (iii) $PF_x$ and $H_2$, and (iv) $PF_x$, $PH_3$, $H_2$, and inert gas, wherein x has any stoichiometric acceptable value, as for example a value of from 3 to 5, as well as corresponding As-based gas mixtures. Such gas mixtures, supplied to the ion implanter in pre-mixed form, or as co-flowed to the implanter from different supply vessels, can be utilized to achieve improvement of beam current of monomer, dimer, and tetramer beams for ion implantation, and to obtain improved source life of the implanter since the gas mixtures would minimize deposits of arsenic or phosphorus that would otherwise form in the implanter when running only hydride source species ($AsH_3$ or $PH_3$), and would also minimize halogen effects that would otherwise occur when running only fluorinated source species ($PF_3$, $PF_5$, $AsF_3$, or $AsF_5$).

DESCRIPTION OF THE RELATED ART

In the field of ion implantation, e.g., in the manufacture of semiconductor devices, there is continuing interest in improving the efficiency of the implant process. Phosphorus and arsenic are commonly used dopant species.

In conventional practice, a source compound for the dopant species is provided in gaseous, liquid, or solid form. The source compound, if not in the gas phase, may be volatilized by sublimation or vaporization techniques from solid form or liquid form source compounds. The resulting dopant gas then is subjected to ionization to form ionic species for implantation in a substrate, either directly as in plasma immersion ion implant processes, or by separation of the ionic species by electrode arrays to form an ion beam containing ions of the desired type that are accelerated through a beamline structure and impinged on a substrate to effect implantation of the ions in the substrate.

In many cases, the dopant source compound utilized for ion implantation is monoatomic in the atom that is ionized to constitute the ionic species for implantation. From the perspective of the volume of dopant source compound that must be provided, stored and processed, it is far preferable to utilize dopant source compounds that are polyatomic in the atom that is ionized to constitute the ionized species for implantation. By using polyatomic dopant source compounds, the amount of dopant ions obtainable per unit volume of the dopant source compound can be substantially increased over monoatomic dopant source compounds, with increasing numbers of dopant atoms in the source compound generally being increasingly preferred. Thus, higher order dopant source compounds (higher number of dopant atoms per molecule of the source compound) are typically preferred over lower order dopant source compounds (lower number of dopant atoms per molecule of the source compound).

SUMMARY

The present disclosure relates to ion implantation of phosphorus or arsenic.

In one aspect, the disclosure relates to an ion implantation system, comprising: an ion implanter comprising an ion source chamber bounded by one or more walls that are constructed of or have deposited thereon solid phosphorus-comprising or arsenic-comprising material.

In another aspect, the disclosure relates to an ion implantation system, comprising:

an ion implanter comprising an ion source chamber; and
a reactor configured to receive gaseous phosphorus or arsenic dopant precursor material and form gaseous polyatomic phosphorus or gaseous polyatomic arsenic therefrom, wherein the reactor is constituted in or coupled in fluid communication with flow circuitry arranged to deliver gas phase material to the ion source chamber for ionization therein to form implant species for implantation in a substrate in the ion implanter.

In a further aspect, the disclosure relates to an ion implantation system, comprising:

an ion implanter comprising an ion source chamber;
a supply of a phosphorus-comprising or arsenic-comprising gas phase precursor, wherein the supply is configured to dispense the precursor to the ion source chamber; and
a monitoring and control assembly configured to operate the ion source chamber in a first phase of operation under conditions that deposit and accumulate solid polyatomic phosphorus or arsenic in the ion source chamber deriving from the precursor dispensed to the ion source chamber from said supply, and in a second phase of operation under conditions that generate vapors comprising dimers or tetramers from the deposited solid polyatomic phosphorus or arsenic for ion implantation A further aspect of the disclosure relates to an ion implantation system, comprising:

an ion implanter comprising an ion source chamber;
a dopant source material supply assembly comprising one or more source vessels containing gaseous phosphorus or arsenic precursor compound, and configured to dispense the precursor compound for use in the ion implanter; and
a conversion assembly configured to convert dispensed gaseous phosphorus or arsenic precursor compound to gaseous polyatomic elemental phosphorus or arsenic material, and to provide the gaseous polyatomic elemental phosphorus or arsenic material for use in the ion source chamber to generate phosphorus or arsenic implantation species therefrom.

Another aspect of the disclosure relates to an ion implantation system, comprising:

an ion implanter comprising an ion source chamber; and a gas supply assembly comprising one or more gas supply vessels arranged to supply a mixture of gases to the ion implanter, wherein the mixture of gases comprises one of (i)-(viii): (i) $PH_3$ and $PF_3$, wherein the concentration of $PH_3$ is in a range of from 40% to 60% by volume, based on the total volume of the mixture of gases; (ii) $PH_3$ and $PF_5$, wherein the concentration of $PH_3$ is in a range of from 50% to 75% by volume, based on the total volume of the mixture of gases; (iii) $PF_x$ and $H_2$, wherein x has any stoichiometric acceptable value, and wherein the concentration of $H_2$ does not exceed 50% by volume, based on the total volume of the mixture of gases; (iv) $PF_x$, $PH_3$, $H_2$, and inert gas, wherein x has any stoichiometric acceptable value; (v) $AsH_3$ and $AsF_3$, wherein the concentration of $AsH_3$ is in a range of from 40% to 60% by volume, based on the total volume of the mixture of gases; (vi) $AsH_3$ and $AsF_5$, wherein the concentration of $AsH_3$ is in a range of from 50% to 75% by volume, based on the total volume of the mixture of gases; (vii) $AsF_x$ and $H_2$, wherein x has any stoichiometric acceptable value, and wherein the concentration of $H_2$ does not exceed 50% by volume, based on the total volume of the mixture of gases; and (viii) $AsF_x$, $AsH_3$, $H_2$, and inert gas, wherein x has any stoichiometric acceptable value.

An additional aspect of the disclosure relates to methods of ion implantation, comprising use of ion implantation systems of the disclosure, as variously described herein.

A further aspect of the disclosure relates to a method of enhancing performance of an ion implanter, comprising delivering to an ion source chamber thereof a gas mixture selected from among (i)-(viii): (i) $PH_3$ and $PF_3$, wherein the concentration of $PH_3$ is in a range of from 40% to 60% by volume, based on the total volume of the mixture of gases; (ii) $PH_3$ and $PF_5$, wherein the concentration of $PH_3$ is in a range of from 50% to 75% by volume, based on the total volume of the mixture of gases; (iii) $PF_x$ and $H_2$, wherein x has any stoichiometric acceptable value, and wherein the concentration of $H_2$ does not exceed 50% by volume, based on the total volume of the mixture of gases; (iv) $PF_x$, $PH_3$, $H_2$, and inert gas, wherein x has any stoichiometric acceptable value; (v) $AsH_3$ and $AsF_3$, wherein the concentration of $AsH_3$ is in a range of from 40% to 60% by volume, based on the total volume of the mixture of gases; (vi) $AsH_3$ and $AsF_5$, wherein the concentration of $AsH_3$ is in a range of from 50% to 75% by volume, based on the total volume of the mixture of gases; (vii) $AsF_x$ and $H_2$, wherein x has any stoichiometric acceptable value, and wherein the concentration of $H_2$ does not exceed 50% by volume, based on the total volume of the mixture of gases; and (viii) $AsF_x$, $AsH_3$, $H_2$, and inert gas, wherein x has any stoichiometric acceptable value.

Other aspects, features and embodiments of the disclosure will be more fully apparent from the ensuing description and appended claims.

DETAILED DESCRIPTION

The present disclosure relates to relates to ion implantation of phosphorus or arsenic, and more specifically to enhanced source techniques for use of solid dopant sources and higher order phosphorus or arsenic implant source material, as well as to associated methods and apparatus.

As used herein, the singular forms "a", "and", and "the" include plural referents unless the context clearly dictates otherwise.

The disclosure, as variously set out herein in respect of features, aspects and embodiments thereof, may in particular implementations be constituted as comprising, consisting, or consisting essentially of, some or all of such features, aspects and embodiments, as well as elements and components thereof being aggregated to constitute various further implementations of the invention. The disclosure is set out herein in various embodiments, and with reference to various features and aspects of the invention. The disclosure contemplates such features, aspects and embodiments in various permutations and combinations, as being within the scope of the disclosure. The disclosure may therefore be specified as comprising, consisting or consisting essentially of, any of such combinations and permutations of these specific features, aspects and embodiments, or a selected one or ones thereof.

The compounds, compositions, components, features, steps and methods of the disclosure may be further specified in particular embodiments by provisos or limitations excluding specific substituents, isotopes, moieties, structures, ingredients, characteristics, steps or conditions, as applicable, in relation to various specifications and exemplifications thereof set forth herein.

The ion implantation systems and processes of the present disclosure achieve enhanced ion source lifetime and performance, in relation to corresponding ion implantation systems and processes not using the dopant source compositions and approaches of the present disclosure.

Figure 1:
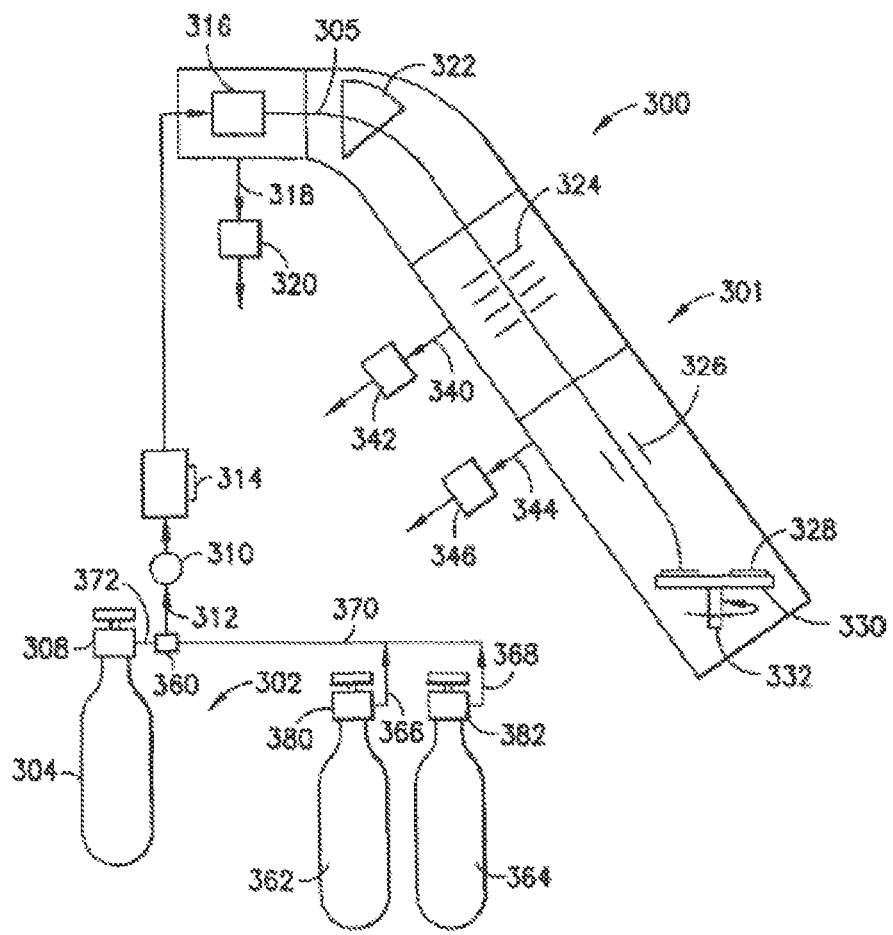
FIG. 1 is a schematic representation of an ion implant process system according to one aspect of the disclosure.

Referring now to the drawings, FIG. 1 is a schematic representation of an ion implant process system according to one aspect of the disclosure, in which the phosphorus and arsenic implantation approaches of the present disclosure can be implemented.

The ion implant process system 300 includes a storage and dispensing vessel 302 containing having an interior volume holding a dopant gas that is supplied for ion implantation doping of a substrate 328 in the illustrated ion implant chamber 301. The storage and dispensing vessel may be of a type containing a sorbent medium on which the dopant gas is physically adsorbed for storage of the gas, with the gas being desorbed from the sorbent medium, under dispensing conditions, for discharge from the vessel. The sorbent medium may be a solid-phase carbon adsorbent material. Sorbent-based vessels of such type are commercially available from Entegris, Inc. (Billerica, Mass., USA) under the trademarks SDS and SAGE. Alternatively, the vessel may be of an internally pressure-regulated type, containing one or more pressure regulators in the interior volume of the vessel.

Such pressure-regulated vessels are commercially available from Entegris, Inc. (Billerica, Mass., USA) under the trademark VAC. As a still further alternative, the vessel may contain the dopant source material in a solid form that is volatilized, e.g., by heating of the vessel and/or its contents, to generate the dopant gas as a vaporization or sublimation product. Solid delivery vessels of such type are commercially available from Entegris, Inc. (Billerica, Mass., USA) under the trademark ProEvap.

In FIG. 1, the storage and dispensing vessel 302 comprises a cylindrical vessel wall 304 enclosing an interior volume holding the dopant gas in an adsorbed state, a free gas state, or a liquefied gas state.

The storage and dispensing vessel 302 includes a valve head 308 coupled in gas flow communication via a dispensing line 372 with a mixing chamber 360 (which is optional), joined in turn to discharge line 312. A pressure sensor 310 may be disposed in the line 312, together with a mass flow controller 314; other optional monitoring and sensing components may be coupled with the line, and interfaced with control means such as actuators, feedback and computer control systems, cycle timers, etc.

The mixing chamber 360 also if used may be joined in flow communication with gas feed line 370, to which are coupled supplemental gas supply vessels 362 and 364, each of which may be of a same or different type relative to one another, and which may be of a same or different type in relation to vessel 302 above described. Vessel 362 may for example contain a diluent gas, and vessel 364 may for example contain a co-species gas, arranged so that dopant gas mixtures can be prepared, containing the dopant gas in combination with the diluent gas and/or the co-species gas.

Supplemental vessel 362 is formed with a main container portion to which is secured a valve head 380 that is in turn coupled with supplemental vessel feed line 366. In like manner, supplemental vessel 364 is formed with a main container portion to which is secured valve head 382. Valve head 382 is coupled to supplemental vessel feed line 368. Feed lines 366 and 368 by such arrangement deliver diluent and/or co-species gas(es) to the mixing chamber 360, to provide a dopant gas mixture containing diluent and/or co-species gas(es), for passage to the ion source of the implanter. For such purpose, the supplemental vessel feed lines 366 and 368, and dispensing line 372 may be equipped with suitable valves, controllers and/or sensors for manually or automatically controlling the flow or other characteristics of the materials dispensed from the vessels and such valves, controllers and/or sensors can be coupled with or connected to the corresponding feed/dispensing lines in any suitable manner.

Such valves may in turn be coupled with valve actuators operatively linked to a central processor unit (CPU). The CPU may be coupled in signal communication relationship with the aforementioned controllers and/or sensors, and programmably arranged to control the rates, conditions and amounts of fluids dispensed from each of the vessels in relation to each other, so that the dopant gas mixture flowed from the mixing chamber 360 in line 312 has a desired composition, temperature, pressure and flow rate for carrying out the ion implantation operation.

In the illustrated system 300, the ion implant chamber 301 contains an ion source 316 receiving the dispensed dopant gas mixture from line 312 and generates an ion beam 305. The ion beam 305 passes through the mass analyzer unit 322 which selects the ions needed and rejects the non-selected ions.

The selected ions pass through the acceleration electrode array 324 and then the deflection electrodes 326. The resulting focused ion beam is impinged on the substrate element 328 disposed on the rotatable holder 330 mounted on spindle 332. The ion beam of dopant ions is used to dope the substrate as desired to form a doped structure.

The respective sections of the ion implant chamber 301 are exhausted through lines 318, 340 and 344 by means of pumps 320, 342 and 346, respectively.

Ion implantation systems of the type shown in FIG. 1 may be employed for phosphorus or arsenic implantation in accordance with the present disclosure, as hereinafter more fully described.

In current ion implantation practices, pre-amorphization implant (PAI) is commonly employed as a basic semiconductor manufacturing technique, in which an initial implant step is employed to intentionally destroy the crystalline structure of substrate material so that channeling in subsequent implant steps is prevented. Germanium is frequently used as a pre-amorphization implant species. Alternatives to germanium are being sought, however, in order to limit the amount of damage and defects characteristic of germanium, so that the device properties of the final semiconductor manufacturing product are less affected.

In accordance with the present disclosure, polyatomic phosphorus and arsenic implant species can be utilized for PAI applications, e.g., in dimer beams of P2+ or As2+ or tetramer beams of P4+ or As4+. Dimer beam or tetramer beam generation using directly or indirectly heated hot filament ion sources and dimer or tetramer beam yield can be significantly affected by source plasma conditions, the efficiency of dimer or tetramer production, and retainment effects. The present disclosure in one aspect thereof contemplates the provision of an ion implantation system comprising an ion implanter comprising an ion source chamber bounded by one or more walls that are constructed of or have deposited thereon phosphorus-comprising or arsenic-comprising material.

The ion source chamber wall in the case of phosphorus can be formed of or coated with solid phosphorus or phosphorous compounds or complexes, to generate phosphorus monomer (P+) or phosphorous dimer (P2+) or phosphorous tetramer (P4+) implant species. A phosphorus-rich environment thereby can be provided that favors dimer ion population in the source plasma produced in the ion source chamber. By using solid phosphorus or phosphorous-comprising alternative materials as ion source chamber wall construction materials, a phosphorus-rich source is provided for the provision of phosphorus dimers. An ion implantation system is thereby provided as a dedicated tool for dimer implants. Such ion implantation systems can be operated with a flow of carrier gas to the ion source chamber, such as hydride gases, fluoride gases, or mixtures of hydride and fluoride gases, as carrier gas compositions to facilitate improved dimer beam performance of the ion implantation system.

By such provision of phosphorus source material in the ion source chamber, phosphorous dimer or tetramer implant species can be utilized for PAI operations, or for other phosphorus implantation applications.

The preceding discussion relating to phosphorus implantation is likewise applicable to arsenic implantation, with an ion source chamber bounded by one or more walls that are constructed of or have deposited thereon arsenic-comprising material.

Figure 2:
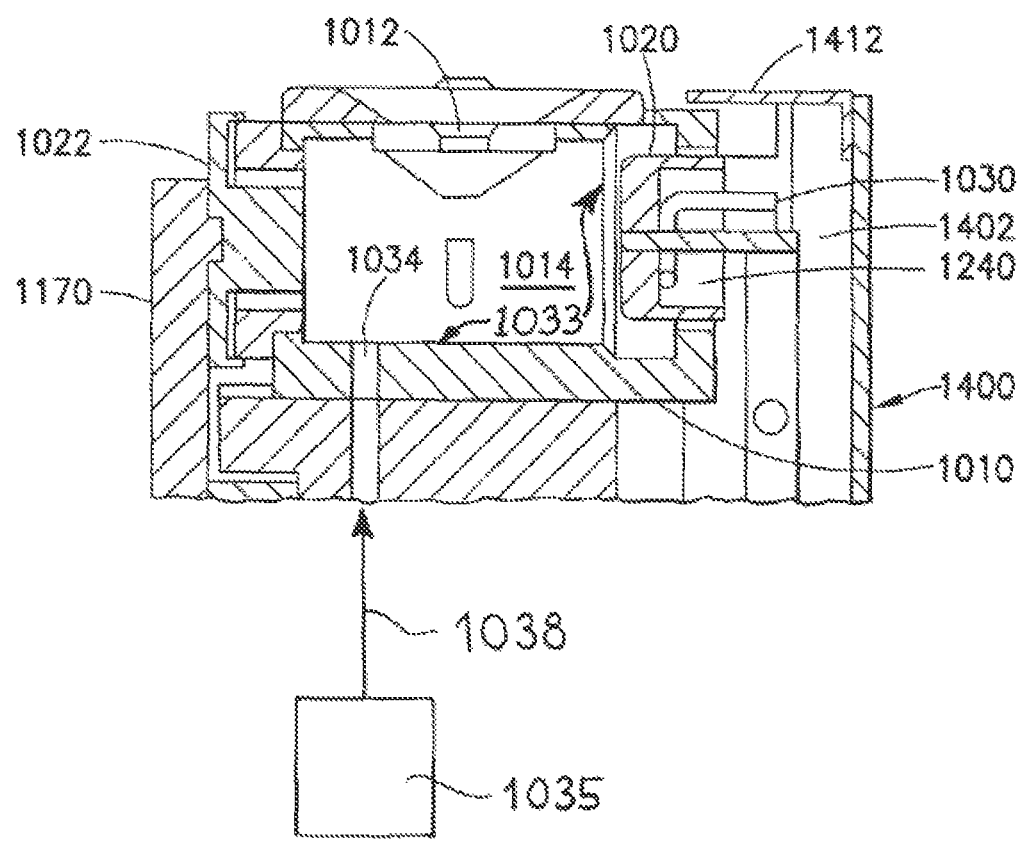
FIG. 2 is a schematic representation of an ion implant process system according to another aspect of the disclosure.

FIG. 2 is a cross-sectional elevation view of an indirectly heated cathode (IHC) ion source according to one embodiment that may be usefully employed for the above-discussed phosphorus or arsenic implantation, or otherwise for phosphorus or arsenic implantation in the broad practice of the disclosure. FIG. 2 shows the arc chamber and related components. Such type of ion source is more fully described in U.S. Pat. No. 7,138,768 to Maciejowski et al.

In this IHC ion source, an arc chamber housing 1010 having an extraction aperture 1012 defines an arc chamber 1014 bounded by walls 1033 that are constructed of or have deposited thereon phosphorus-comprising or arsenic-comprising material. A cathode 1020 and a repeller electrode 1022 are positioned within the arc chamber 1014. A filament 1030, positioned outside arc chamber 1014 in close proximity to cathode 1020, produces heating of the cathode. Carrier gas may be provided to arc chamber 1014 through a gas inlet 1034 that is coupled by gas feed line 1038 to the gas source 1035. The gas source 1035 may include supply vessel(s) or other source structure for supplying carrier gas to the arc chamber 1014, containing hydride gas, fluoride gas, or hydride and fluoride gas mixture. The hydride gas may comprise hydrogen, hydrogen fluoride, or other gaseous hydride compound. The fluoride gas may comprise fluorine, hydrogen fluoride, or other gaseous fluoride compound. The carrier gas may include co-flow gases, diluents, cleaning gases, or other gaseous components. In various embodiments, the carrier gas comprises a gaseous phosphorus compound, such as phosphine, phosphorus trifluoride, phosphorous tetrafluoride, or mixtures of two or more thereof.

In the FIG. 2 system, an arc power supply has a positive terminal connected to arc chamber housing 1010 and a negative terminal connected to cathode 1020. Repeller electrode 1022 can be floating or can be connected to the negative terminal of arc power supply. The arc power supply may have a rating of 100 volts at 25 amperes and may operate at about 70 volts. The arc power supply accelerates electrons emitted by cathode 1020 into the plasma in arc chamber 1014.

A bias power supply having a positive terminal is connected to cathode 1020 and a negative terminal connected to filament 1030. The bias power supply may have a rating of 600 volts at 4 amperes and may operate at a current of about 2.5 amperes and a voltage of about 350 volts. The bias power supply accelerates electrons emitted by filament 1030 to cathode 1020 to produce heating of cathode 1020.

A filament power supply has output terminals connected to filament 1030. The filament power supply may have a rating of 6 volts at 200 amperes and may operate at a filament current of about 140 to 170 amperes. The filament power supply produces heating of filament 1030, which in turn generates electrons that are accelerated toward cathode 1020 for heating of cathode 1020.

A source magnet produces a magnetic field within the arc chamber 1014. Typically, the source magnet includes poles at opposite ends of arc chamber 1014. The direction of the magnetic field may be reversed without affecting operation of the ion source. The source magnet is connected to a magnet power supply, which may have a rating of 20 volts at 60 amperes. The magnetic field produces increased interaction between electrons emitted by cathode 1020 and the plasma in arc chamber 1014.

It will be understood that the voltage and current ratings and the operating voltages and currents of the various power supplies are given by way of example only.

An extraction electrode and a suppression electrode are suitably positioned in front of extraction aperture 1012. Each of extraction electrode and suppression electrode has an aperture aligned with extraction aperture 1012 for extraction of a well-defined ion beam. The extraction electrode and suppression electrode are connected to respective power supplies.

An ion source controller can be utilized to provide control of the ion source through an isolation circuit. In other embodiments, circuitry for performing the isolation function may be built into power supplies. The ion source controller may be a programmed controller or a dedicated special purpose controller. In one embodiment, the ion source controller is incorporated into the main control computer of an ion implanter.

When the ion source is in operation, the filament 1030 is heated resistively by filament current to thermionic emission temperatures, which may be on the order of 2200° C.

Electrons emitted by filament 1030 are accelerated by the bias voltage between filament 1030 and cathode 1020 and bombard and heat cathode 1020. The cathode 1020 is heated by electron bombardment to thermionic emission temperatures. Electrons emitted by cathode 1020 are accelerated by the arc voltage and ionize gas molecules from the gas source within arc chamber 1014 to produce a plasma discharge. The electrons within arc chamber 1014 are caused to follow spiral trajectories by the magnetic field. Repeller electrode 1022 builds up a negative charge as a result of incident electrons and eventually has a sufficient negative charge to repel electrons back through the arc chamber 1014, producing additional ionizing collisions.

The repeller electrode 1022 is mounted to the arc chamber base by a conductive support member 1170. The cathode 1020 is mounted in an opening at one end of arc chamber housing 1010 but does not physically contact arc chamber housing 1010. Preferably, a gap between cathode 1020 and arc chamber housing 1010 is on the order of about 0.050 inch.

There is a gap between the cathode 1020 and the arc chamber housing 1010. The heating loop of filament 1030 is located within the cup-shaped cavity 1240 and migration of the plasma from arc chamber 1014 to filament 1030 is minimal.

The ion source may further include a shield 1400. Shield 1400 substantially encloses a region 1402 outside arc chamber 1014 in proximity to cathode 1020 and filament 1030. A function of shield 1400 is to form a barrier to electrons and plasma in the vicinity of cathode 1020 and filament 1030. The shield 1400 substantially encloses region 1402 in the sense that it forms a barrier to electrons and plasma but does not seal region 1402.

The shield 1400 may have a box-like structure and may be fabricated of a refractory metal. The shield 1400 includes top wall 1412. It will be understood that different shield configurations may be utilized. For example, shield 1400 may have a flat main wall and may be mounted to a filament clamp using standoffs. Furthermore, shield 1400 may be mounted to another element of the ion source.

Ion sources utilized in the practice of the present disclosure may be of any suitable type, and in alternative to indirectly heated cathode (IHC) ion sources, the ion source may be a Bernas source, a microwave source, a radio frequency (RF) source, or other type ion source.

Concerning the direction of current implantation technology, the trend toward smaller node sizes is driving ongoing efforts to develop ultra-shallow junction implants of phosphorus and arsenic. This in turn is creating a need to improve dimer or tetramer beam currents (e.g. P4+, P2+, As4+, As2+). Generally, using solid sources of phosphorus or arsenic, such as elemental phosphorus or elemental arsenic, can provide good dimer and tetramer beam currents since these materials are typically present in the form of As4 and P4 in the solid phase, with the resulting vapor also having a tetramer form. Solid sources, however, have various disadvantages, such as poor flow control due to the inability to use valves and mass flow controllers (MFCs) at the high temperatures required for vaporization of solid source phosphorus and arsenic materials. In addition, if changes in beam current are desired, then the operating temperature of the solid source vaporizer must be changed, which frequently involves long time lags for switching between dopant sources, because one vaporizer must cool while another heats up to the desired temperature. Further, there are significant hazards associated with handling solid phosphorus and arsenic materials, particularly during change-out if the vaporizer is still warm. Further, beam currents may change as the phosphorus and arsenic solids are utilized during operation of the vaporizer, due to changes in heat transfer area as the solid is volatilized. Still further, during use of the vaporizer, it is generally difficult to determine the remaining inventory of the phosphorus or arsenic solids in the vaporizer.

The foregoing difficulties are addressed in another aspect of the present disclosure, by the provision of an ion implantation system, comprising:

an ion implanter comprising an ion source chamber; and a reactor configured to receive gaseous phosphorus or arsenic dopant precursor material and form gaseous polyatomic phosphorus or gaseous polyatomic arsenic therefrom, e.g., in the form of gaseous dimer or gaseous tetramer phosphorus, or gaseous dimer or gaseous tetramer arsenic, wherein the reactor is constituted in or coupled in fluid communication with flow circuitry arranged to deliver gas phase material to the ion source chamber for ionization therein to form implant species for implantation in a substrate in the ion implanter.

For example, the reactor can be configured and operated to decompose a phosphorus hydride (phosphine) or arsenic hydride (arsine) dopant precursor material, to form corresponding solid elemental phosphorus or arsenic, and hydrogen, to produce gaseous polyatomic phosphorus or gaseous polyatomic arsenic, e.g., gas phase dimer or tetramer material.

In another variation, the reactor can be arranged to receive gas phase As or P molecular source material, such as arsine or phosphine or other arsenic or phosphorus compound in gaseous form, and to convert it to As or P which would also be in the gas phase (g) and could be of the form As (g), P(g), or higher order As or P gas phase species such as As4(g) or P4(g).

In a further variation, the reactor can be configured to receive the dopant precursor material such as a hydride or fluoride compound, and would be operated to decompose the dopant precursor material to form a solid arsenic or phosphorus in an accumulation mode within the reactor, and after a predetermined amount of the solid elemental arsenic or phosphorus is accumulated, then the reactor would be heated to higher temperature to vaporize the solid elemental arsenic or phosphorus, to yield gaseous arsenic or phosphorus in a polyatomic form, e.g., a dimer or tetramer form.

In yet another variation, the reactor may be arranged to receive the dopant precursor material in the form of a compound, such as a (arsine or phosphine) hydride compound, that then is decomposed to form vapor phase arsenic or phosphorus in a polyatomic, e.g., dimer or tetramer, form that is continuously flowed from the reactor to the ion source chamber of the implanter.

The reactor thus is arranged in flow communication with gas delivery lines of the ion implantation system, in which gaseous phosphorus or arsenic dopant precursor material, such as phosphine or arsine gas, is flowed from a supply vessel or other source of same to the reactor.

The reactor is maintained at sufficiently high temperature to cause the phosphine or arsine to react in the production process for forming the desired gaseous polyatomic elemental phosphorus or arsenic product. The desired gaseous polyatomic elemental phosphorus or arsenic product that is flowed to the reactor through the gas delivery line(s) to the ion source chamber. Temperature of the reactor and of the gas delivery lines between the reactor and the ion source chamber is maintained at suitable level to avoid condensation of the gaseous tetramers upstream of the ion source chamber.

The reactor can be designed to effect a predetermined extent of reaction of the influent phosphine or arsine dopant precursor gas, or other phosphorus or arsenic dopant precursor gas. The reactor may be of any suitable size and conformation, and may for example be of cylindrical, rectangular, square, or other cross-sectional shape. The reactor in some embodiments may comprise a section of the gas delivery line to the ion source chamber. In other embodiments, it may be arranged concentrically with respect to the gas delivery lines upstream and downstream of the reactor. In general, any suitable design of the reactor that is effective to decompose the phosphorus or arsenic source gas and produce vapor phase tetramers, can be employed. The reactor may be heated in any suitable manner, e.g., via resistive heating elements within or in thermal contact with the reactor, via radiative heating of the reactor, via conductive heating of the reactor, via convective heating of the reactor, or any other arrangement and heat transfer modality that is effective to provide temperature necessary for decomposition of the phosphorus or arsenic source gas to produce the desired elemental phosphorus or arsenic product.

The reactor may be appropriately sized to provide retention times that yield the desired extent of decomposition of the phosphorus or arsenic source gas at the flow rates of such gas that are utilized in operation of the ion implantation system including the reactor. In embodiments, the reactor may be constructed with internal media or components to provide enhanced heat transfer to, and/or residence time of, source gas flowed through the reactor. Such internal media or components may comprise, by way of example, baffles, vanes, screw elements, or other flow directing members that yield extended gas flow paths in the reactor and extended heat transfer surface for heating of the gas flowing through the reactor. The internal media or components may additionally, or alternatively, comprise packing media or components such as beads, metal foams, glass wool, or the like, which provide tortuous flow paths, and heat transfer enhancement.

In other embodiments, the reactor may be provided in the form of a tube that is wrapped around the arc chamber of the ion implantation system, to effect heating of the tube and gas contents therein, or the reactor may be provided in the form of channels disposed in the interior volume of the arc chamber that are not directly exposed to the plasma, e.g., so that the desired tetramers are formed in situ in the channels in the arc chamber, and discharged from the channels to the interior volume in the chamber.

When deployed in the flow circuitry delivering the dopant precursor gas to the ion source chamber, the reactor can be located upstream or downstream of a mass flow controller (MFC) in such circuitry. The reactor can be dedicated to one dopant precursor gas or can be located in a common line through which all gases are flowed to the ion source chamber. As mentioned, it is essential that the vapor phase elemental phosphorus or arsenic species do not condense between the reactor and the ion source chamber. This can be achieved by appropriate temperature control of the corresponding flow circuitry. In one embodiment, the requisite temperature to prevent condensation of the vapor phase tetramer may be accommodated by conductively heating the gas delivery source tube to the ion source chamber for a length of from 1.25 cm to 30.5 cm (0.5-12 inches) from the ion source chamber.

In another embodiment, a heat transfer member, such as a metal clamshell made of suitable metal, preferably a high conductance metal such as W, Ni, Cu, Mo, Au, Al, Ag, or the like, is placed around the gas delivery source tube, with one end of the clamshell in contact with the ion source chamber to enable heat to be conducted upstream through the source tube.

In yet another embodiment, the gas delivery source tube could be heated with resistive heating elements, or the tube, as previously discussed, could be wrapped around the ion source chamber.

In the reactor, the reaction can be controlled in any suitable manner, e.g., by controlling flow rate of reactant dopant precursor gases (such as phosphine or arsine), by controlling temperature of the reactor, by controlling pressure within the reactor by appropriate use of flow control valves, flow restriction orifices, etc., or by combinations of the foregoing. As an illustrative example, by appropriate deployment of sensors in a monitoring and control assembly, beam current of tetramers can be monitored, to generate a beam current signal transmitted to the controller, which then responsively transmits control signals to modulate flow and/or temperature and/or pressure by appropriate controlled devices provided for such purpose, and with the flow, temperature, and pressure being monitored to ensure precise modulation of such parameters.

The reactor thus can be situated in a separate line to the ion source chamber, distinct from other gas supply lines to the chamber, or the reactor can be situated in a single common line to the ion source chamber so that all gases delivered to the ion source chamber pass through the reactor. In the latter case, the reactor can be shut off or temperature therein can be controllably lowered when other dopant species are flowed through the reactor.

The provision of a reactor for decomposition of phosphorus or arsenic dopant precursor gases to form gas phase tetramer species enables phosphorus or arsenic dopant precursor gases to be supplied in suitable source vessels. Accordingly, dopants can be switched from one to another very quickly, without exposure to solid forms of phosphorus or arsenic, and monitoring of dopant precursor inventory is readily achieved since the dopant precursor is in gaseous form (e.g., as phosphine or arsine), by the simple expedient of monitoring pressure of the gas from the source vessel. Further, because the dopant precursor is supplied in the first instance in gaseous form, beam current can be controlled via control of the dopant precursor flow rate (of phosphine or arsine gas). With gas phase dopant precursor being employed, the time required for change-out of dopant precursor supply vessels is far less than the time required to replace a solid vaporizer, when solid vaporizers are employed to supply dopant precursor, since the exhausted vaporizer must be allowed to cool, and a new vaporizer must be filled with dopant precursor, installed, and heated to operating temperature.

Accordingly, the provision of a reactor in the ion implantation system for decomposition of phosphorus- or arsenic-containing gases, thereby permitting gaseous dopant precursors to be utilized while concurrently obtaining the benefits, without the disadvantages, of using solid phosphorus or arsenic source material, achieves a substantial improvement of the ion implantation system.

It is to be appreciated that the ion implantation systems described herein, including those described hereinabove as well as those described hereafter, may be of widely varying types, and may for example comprise ion implantation systems wherein the ion implanter is a beam line implanter, ion implantation systems wherein the ion implanter is configured for manufacture of solar panels or other photovoltaic products, or ion implantation systems wherein the ion implanter is of other types, or is specifically configured for manufacture of other ion implanted components, structures, assemblies, or other products. Thus the ion implantation system may be configured to manufacture semiconductor or other microelectronic products, or to reduce photovoltaic cells in which n-type donor dopant such as phosphorus is implanted in forming p-n junctions in the manufacture of crystalline silicon solar cells.

The disclosure in a further aspect relates to an ion implantation system, comprising: an ion implanter comprising an ion source chamber; a dopant source material supply assembly comprising one or more source vessels containing gaseous phosphorus or arsenic precursor compound, and configured to dispense the precursor compound for use in the ion implanter; and a conversion assembly configured to convert dispensed gaseous phosphorus or arsenic precursor compound to gaseous polyatomic elemental phosphorus or arsenic material, and to provide the gaseous polyatomic elemental phosphorus or arsenic material for use in the ion source chamber to generate phosphorus or arsenic implantation species therefrom.

In such ion implantation system, the conversion assembly in one embodiment comprises a reactor for thermally converting the dispensed gaseous phosphorus or arsenic precursor compound to the gaseous polyatomic elemental phosphorus or arsenic material.

In another embodiment of such ion implantation system, the conversion assembly comprises a monitoring and control assembly configured to operate the ion source chamber in a first phase of operation under conditions that deposit and accumulate solid polyatomic phosphorus or arsenic in the ion source chamber deriving from the precursor compound dispensed to the ion source chamber from such supply assembly, and in a second phase of operation under conditions that generate vapors comprising dimers or tetramers from the deposited solid polyatomic phosphorus or arsenic for ion implantation.

In such ion implantation system, the aforementioned ion source chamber may comprise a first ion source chamber, with the ion implantation system comprising a second ion source chamber, configured to receive precursor dispensed from the supply and to operate in a same operational manner as the first ion source chamber but offset in operation so that the second ion source chamber is operated in the first phase of operation while the first ion source chamber is operated in the second phase of operation, and so that the second ion source chamber is operated in the second phase of operation while the first ion source chamber is operated in the first phase of operation.

The system thus may be embodied with two ion sources in a same implant tool, with one in a deposit accumulation mode, and the other in an implant mode, or alternatively the monitoring and control system could be utilized with two or more separate implant tools, so that a selected one or ones thereof are in the first phase of operation, while other one or ones thereof are in the second phase of operation, e.g., in a cyclic repetitive and alternating fashion, in which each of the ion sources undergoes successive first and second phases of operation.

The disclosure in another aspect relates to an ion implantation system, comprising: an ion implanter comprising an ion source chamber; and a gas supply assembly comprising one or more gas supply vessels arranged to supply a mixture of gases to the ion implanter, wherein the mixture of gases comprises one of (i)-(viii): (i) $PH_3$ and $PF_3$, wherein the concentration of $PH_3$ is in a range of from 40% to 60% by volume, based on the total volume of the mixture of gases; (ii) $PH_3$ and $PF_5$, wherein the concentration of $PH_3$ is in a range of from 50% to 75% by volume, based on the total volume of the mixture of gases; (iii) $PF_x$ and $H_2$, wherein x has any stoichiometric acceptable value, and wherein the concentration of $H_2$ does not exceed 50% by volume, based on the total volume of the mixture of gases; (iv) $PF_x$, $PH_3$, $H_2$, and inert gas, wherein x has any stoichiometric acceptable value; (v) $AsH_3$ and $AsF_3$, wherein the concentration of $AsH_3$ is in a range of from 40% to 60% by volume, based on the total volume of the mixture of gases; (vi) $AsH_3$ and $AsF_5$, wherein the concentration of $AsH_3$ is in a range of from 50% to 75% by volume, based on the total volume of the mixture of gases; (vii) $AsF_x$ and $H_2$, wherein x has any stoichiometric acceptable value, and wherein the concentration of $H_2$ does not exceed 50% by volume, based on the total volume of the mixture of gases; and (viii) $AsF_x$, $AsH_3$, $H_2$, and inert gas, wherein x has any stoichiometric acceptable value. The inert gas may comprise inert gas selected from the group consisting of argon, neon, nitrogen, xenon, helium, and mixtures of two or more thereof.

The disclosure in a still further aspect relates to an ion implantation method, comprising use of an ion implantation system as variously described herein.

In another method aspect, the disclosure relates to a method of enhancing performance of an ion implanter, comprising delivering to an ion source chamber thereof a gas mixture selected from among (i)-(viii): (i) $PH_3$ and $PF_3$, wherein the concentration of $PH_3$ is in a range of from 40% to 60% by volume, based on the total volume of the mixture of gases; (ii) $PH_3$ and $PF_5$, wherein the concentration of $PH_3$ is in a range of from 50% to 75% by volume, based on the total volume of the mixture of gases; (iii) $PF_x$, and $H_2$, wherein x has any stoichiometric acceptable value, and wherein the concentration of $H_2$ does not exceed 50% by volume, based on the total volume of the mixture of gases; (iv) $PF_x$, $PH_3$, $H_2$, and inert gas, wherein x has any stoichiometric acceptable value; (v) $AsH_3$ and $AsF_3$, wherein the concentration of $AsH_3$ is in a range of from 40% to 60% by volume, based on the total volume of the mixture of gases; (vi) $AsH_3$ and $AsF_5$, wherein the concentration of $AsH_3$ is in a range of from 50% to 75% by volume, based on the total volume of the mixture of gases; (vii) $AsF_x$ and $H_2$, wherein x has any stoichiometric acceptable value, and wherein the concentration of $H_2$ does not exceed 50% by volume, based on the total volume of the mixture of gases; and (viii) $AsF_x$, $AsH_3$, $H_2$, and inert gas, wherein x has any stoichiometric acceptable value.

Figure 3:
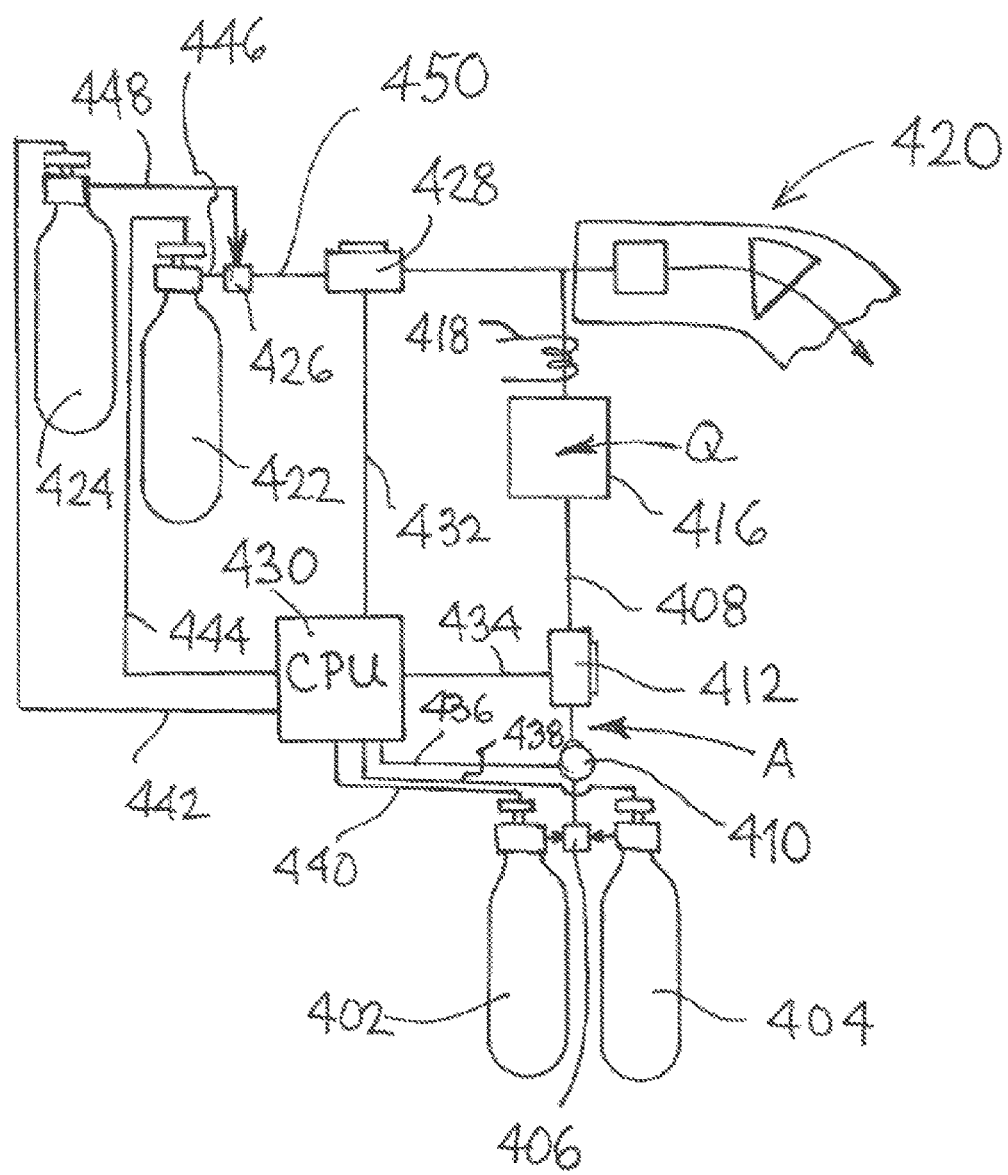
FIG. 3 is a schematic representation of an ion implant process system according to a further aspect of the disclosure.

FIG. 3 is a schematic representation of an ion implant process system according to a further aspect of the disclosure, utilizing a reactor for decomposition of gaseous phosphorus or arsenic dopant precursors.

In the FIG. 3 system, two dopant source gas vessels 402 and 404 are provided, containing dopant source gas such as phosphine or arsine. The vessels 402, 404 are coupled to a dispensing chamber 406. These vessels are normally arranged so that one of the vessels is dispensing gas to the chamber 406, while the other is in standby mode, containing a full fill of the dopant source gas, and with the vessels being able to be switched out, by appropriate modulation of their respective flow control valves in the valve heads of the respective vessels. The flow control valves may be operatively linked with a CPU 430 by means of signal transmission lines 438 and 440 coupled with suitable valve actuators for the respective valves of the vessels 402 and 404, so that the CPU controls the respective valves to accommodate dispensing by an on-line one of the two vessels, with the flow control valve of the other vessel being retained in a closed condition. The CPU thereby is arranged so that it can effect switching of the two vessels, so that the fresh fulfilled vessel is switched to the dispensing mode by opening of its flow control valve, and so that the depleted vessel is switched to a change-out mode by closing of its formerly open flow control valve.

From dispensing chamber 406, the dispensed dopant source gas flows in dispensing line 408 containing pressure sensor 410. The pressure sensor is linked in signal transmission relationship with CPU 430, by the signal transmission line 436. The dispensed dopant source gas in dispensing line 408 flows through mass flow controller 412 and is discharged at a flow rate determined by the setting of the mass flow controller, which may be adjusted by the CPU 430, which is arranged to transmit control signals for such purpose to the mass flow controller 412 in signal transmission line 434. The dispensed dopant source gas then enters reactor 416. The reactor is heated, as shown by the schematic arrow Q denoting he transmission to the reactor from a suitable source (e.g., a heater configured to heat the reactor to suitable elevated temperature, by any appropriate heating modality, such as conductive, radiative, convective, or other heating mode).

In the reactor, the dopant source gas is decomposed to form elemental phosphorus, or elemental arsenic, as applicable, with the elemental material then forming a dimer or tetramer gas phase material for subsequent implantation. The dimer or tetramer gas phase material then flows through the downstream portion of dispensing line 408 into the ion implanter 420. In order to prevent condensation of the dimer or tetramer gas phase material, the dispensing line 408 is heated to appropriate temperature preventing such compensation, by the heater 418. Heater 418 may comprise any suitable heating apparatus or device, and may for example be constituted by electrical resistance heating coil. In the ion implanter 420, the dimer or tetramer gas phase material passes to the ion source chamber for ionization to form implant species that then are implanted in a substrate (not shown), as previously described.

The FIG. 3 system also includes gas supply vessels 422 and 424, to supply additional gases, e.g., diluents, cleaning gases, carrier gases, co-flow gases, etc. to the ion implanter 420. The CPU 430 in like manner to the arrangement previously described involving vessels 402 and 404, is coupled by signal transmission lines 442 and 444 to the flow control valve actuators of vessels 424 and 422, respectively. Gas from the vessel 422 is dispensed in line 446 to the dispensing chamber 426, which may concurrently or sequentially receive gas in line 448 from vessel 424. From the dispensing chamber 426, gas flows in feed line 450 containing mass flow controller 428 to the ion implanter 420. The CPU 430 is coupled in signal transmission relationship to mass flow controller 428, by signal transmission line 432.

By the foregoing arrangement, the CPU 430 receives a pressure sensing signal indicative of the dispensed dopant source gas pressure from pressure sensor 410 in signal transmission line 436, and the CPU is configured to responsively or independently modulate the settings of mass flow controllers 412 and 428, and the flow control valves of the gas vessels 402, 404, 424, and 422, for operation of the ion implantation system. The CPU may be of any suitable type, and may for example comprise a microprocessor, programmable logic controller, special purpose programmable computer, or other central processing unit that is configured and operative for monitoring and control of the ion implantation system, as a component with the appropriate sensors, signal transmission lines, etc. of a monitoring and control assembly for the ion implantation system. Although not specifically shown, the CPU may be arranged and configured to monitor and/or control the heating of the reactor 416 and the output of the heater 418, to ensure the desired production and maintenance of dimer or tetramer dopant material as gas phase material that is fed to the ion implanter 420.

It will be recognized that alternative ion implant process system arrangements can be employed. For example, the gas supply vessels may be arranged so that each dispenses gas into a line containing a dedicated mass flow controller, with the respective gas lines being combined downstream of the mass flow controllers into a single gas flow line to the ion source chamber. The reactor for conversion of the gaseous phosphine or arsine dopant source compound to higher-order polyatomic gaseous dopant material may be located in such single gas flow line to the ion source chamber. The respective gases can also flow separately to the ion source, or separate ones of multiple gas flow streams of dopant, carrier gas, cleaning gas, co-species gas, etc. could be combined in any of various permutations, as may be necessary or desirable in a given application of the process and apparatus of the disclosure, so that some of such gas streams are combined upstream of the ion source chamber, while others flow directly without mixing or combination to the ion source chamber. The gas supply vessels may instead of actuatable valves thereon, be equipped with manual valves, with actuatable flow control valves located downstream from the respective gas supply vessels.

Figure 4:
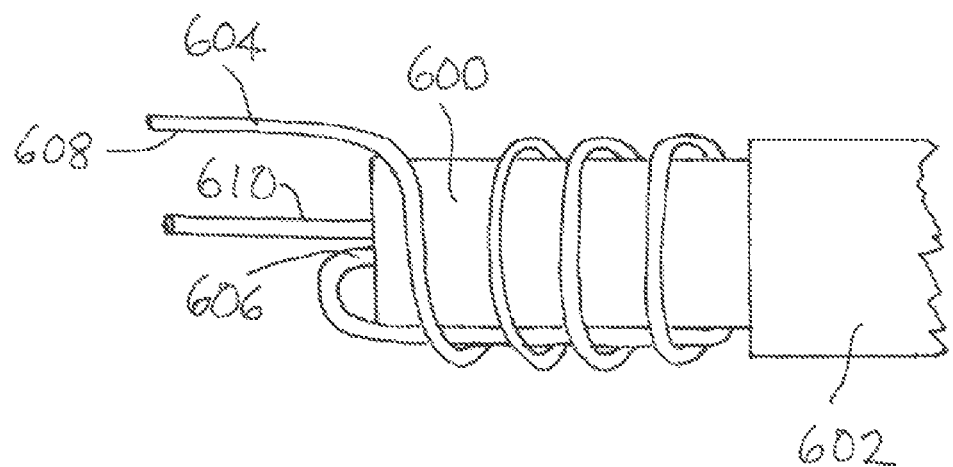
FIG. 4 is a schematic representation of an ion implant process system including an ion source chamber in heat transfer relationship with a dopant source gas feed line.

FIG. 4 is a schematic representation of an ion implant process system including an ion source chamber 600 in heat transfer relationship with a dopant source gas feed line 604. The ion source chamber 600 is arranged as a component of the implanter 602. In this embodiment, the dopant source gas feed line 604 is helically wrapped around the ion source chamber 600 from a proximal end 608 that successively encircles the ion source and culminates in a portion of the line that extends axially along the surface of the ion source chamber and at a distal end 606 communicates in gas flow communication with the interior volume of the ion source chamber 600.

The dopant source gas feed line 604 in this arrangement is heated by the ion source chamber 600, which is at elevated temperature in operation. In this manner, the dopant source gas feed line 604 is heated to a temperature at which gaseous dimer or tetramer phosphorus or arsenic material is formed, if the feed line 604 is arranged as a reactor, e.g., for phosphine or arsine decomposition and dimer/tetramer formation. Alternatively, if such gaseous dimer or tetramer material has been formed in a reactor upstream of the proximal end 608 of the line 604, then the line 604 is simply heated to prevent condensation of the dimer or tetramer material being flowed through line 604 to the ion source chamber 600.

The FIG. 4 apparatus further includes a gas feed line 610, for concurrent, prior, or subsequent flow to the ion source chamber 600 of additional gas, e.g., a diluent gas, carrier gas, cleaning gas, co-flow gas, etc.

Figure 5:
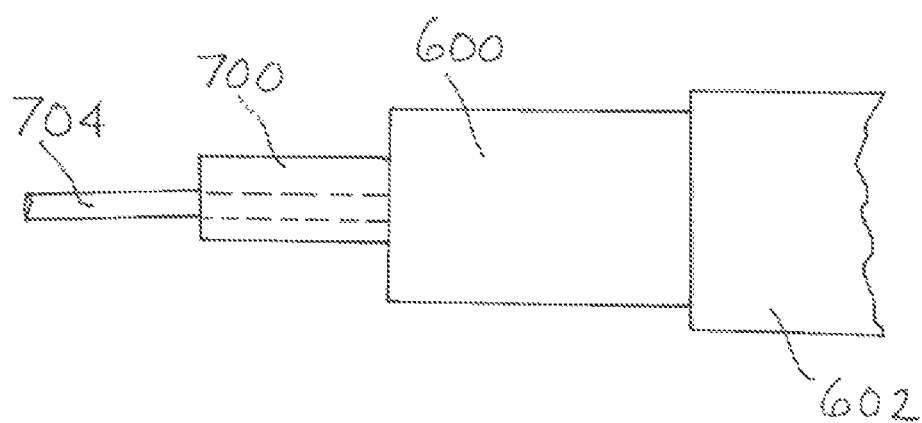
FIG. 5 is a schematic representation of an ion implant process system including an ion source chamber arranged with a heat transfer member operatively positioned to heat the dopant source gas feed line.

FIG. 5 is a schematic representation of an ion implant process system including an ion source chamber 600 constituting a part of the implanter 602 and arranged with a heat transfer member 700 operatively positioned to heat the dopant source gas feed line 704. By this arrangement, the heat generated by the ion source chamber 600 in operation is conductively transmitted by heat transfer member 700 to the gas feed line 704, so that condensation of the dopant source material flowing to the ion source chamber in line 704 does not occur.

Figure 6:
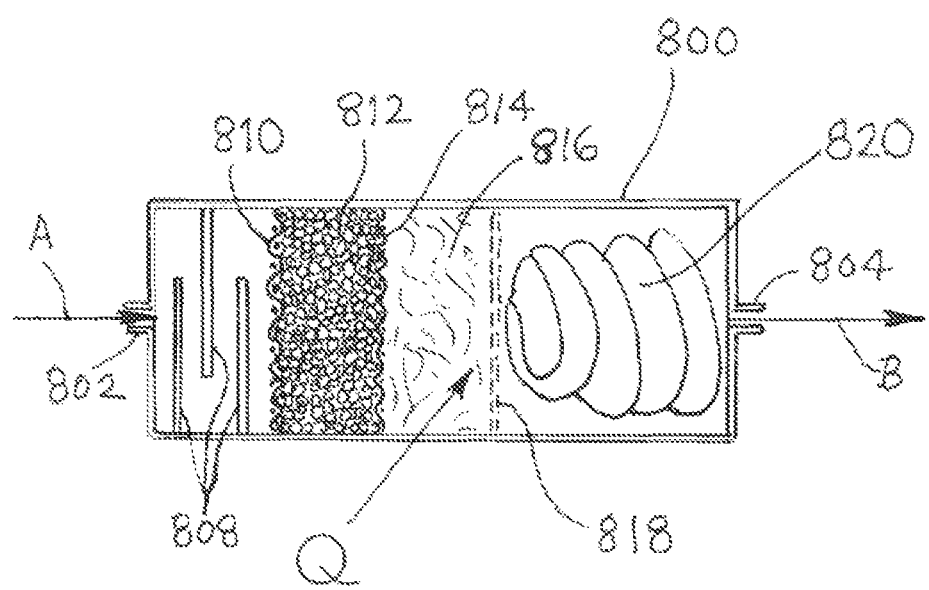
FIG. 6 is a dopant source gas reactor that is positioned in the dopant source gas feed line to the ion source chamber of an ion implant process system, to generate polyatomic phosphorous or arsenic dopant species.

FIG. 6 is a schematic representation of a dopant source gas reactor that is positioned in the dopant source gas feed line to the ion source chamber of an ion implant process system, to generate polyatomic implant species. The reactor is adapted to receive a phosphorus-comprising or arsenic-comprising gaseous dopant source material for decomposition therein to form elemental phosphorus or arsenic that in turn produces a phosphorus or arsenic dimer or tetramer material for implantation. The reactor comprises a housing 800 having an inlet 802 for receiving phosphorus-comprising or arsenic-comprising gaseous dopant source material entering the interior volume of the reactor as indicated by arrow A. Heat input Q is transmitted to the reactor by a suitable heat source, which may be a conductive, convective, radiative, or other heater type.

The dimer or tetramer material produced in the reactor is discharged therefrom at outlet 804 in the direction indicated by arrow B.

The reactor may contain internal structure, components, or materials to provide extended heat transfer surface and/or modulation of residence time of material flowing through the reactor. Accordingly, the reactor may contain baffles 808, as shown, providing an extended fluid flow path. Additionally, or alternatively, the reactor may contain bead material 812 in a bed that is fixedly positioned by the retention screens 810 and 814. Additionally, or alternatively, the reactor may contain a fibrous mat or foam material 816 that may be fixed in position in the interior volume of the reactor by the foraminous plate 818, as illustrated. Additionally, or alternatively, the reactor may contain a spiral shaped body 820 that serves to impart a swirling motion to fluid flowing through the reactor. It will be appreciated that the reactor may contain a wide variety of internal components and/or materials, serving to achieve desired heating of material in the reactor, and providing an appropriate residence time for material flowing through the reactor so that dimer and tetramer species are advantageously formed from the influent gaseous phosphorus-comprising or arsenic-comprising precursor material.

Historically, solid phosphorus and solid arsenic were employed as primary feed materials for the generation of phosphorus and arsenic ions in ion implantation processes, wherein the solid material was heated to generate vapors that were delivered to the ion source chamber for ionization and ion extraction. Since phosphorus and arsenic vapors are composed of tetramers (P4 and As4) that decompose into dimers and them into monomers at elevated temperature, solid phosphorus and solid arsenic are ideal feed materials for forming dimers and tetramers. The use of such solids has been abandoned in the ion implantation industry for more convenient gas phase precursors such as phosphine and arsine that are used to generate corresponding monomers (P+ and As+), and any return to use of solid phosphorus and arsenic feed materials would require costly ion implanter retrofits or replacement with new ion implantation systems that could accommodate such solid phosphorus and arsenic feed materials. Although phosphine and arsine can be used to generate dimers and tetramers in the ion implanter under certain conditions, the resulting production of such dimers and tetramers is at such low concentrations as to be commercially undesirable.

The present disclosure in another aspect overcomes such deficiencies. Both phosphine and arsine decompose into elemental phosphorus and arsenic at elevated temperature, a process that likely occurs in conventional ion implanters, but is masked by the fact that any solid elemental phosphorus or arsenic that forms either (i) evaporates as a result of the very high temperatures in the ion source chamber, or (ii) reacts with hydrogen deriving from the original phosphorus or arsenic hydride compound and is returned back into the gas phase as phosphine or arsine, or (iii) becomes ionized as monomer ions, or (iv) is pumped out of the ion source chamber before it can form dimers or tetramers.

The present disclosure in this respect implements a fundamental departure from conventional ion implantation system operation, in which the ion source chamber receives gaseous phosphine or arsine and is operated at operating conditions including temperature at which the phosphine or arsine is decomposed to deposit solid phosphorus or solid arsenic in the ion source chamber, in a first "accumulation" mode of operation that is continued until a predetermined desired amount of solid phosphorus or solid arsenic has been deposited in the ion source chamber.

Following this period of "accumulation" mode of operation, in which the ion source chamber has been loaded with a predetermined amount of solid phosphorus or solid arsenic, the ion implantation system is operated in a primary "implantation" mode of operation. In this implantation mode of operation, gaseous phosphine or arsine is flowed into the ion source chamber containing the accumulated elemental phosphorus or arsenic solids under operating conditions in which the ion source chamber is "tuned" to take advantage of the accumulated elemental solids to generate vapors rich in dimers or tetramers which are extracted for ion implantation.

For such purpose, the ion implantation system may comprise a monitoring and control assembly configured to operate the ion source chamber in a first phase of operation under conditions that deposit and accumulate solid polyatomic phosphorus or arsenic in the ion source chamber deriving from the precursor dispensed to the ion source chamber from said supply, and in a second phase of operation under conditions that generate vapors comprising dimers or tetramers from the deposited solid polyatomic phosphorus or arsenic for ion implantation.

As in the ion implantation system previously discussed, the aforementioned ion source chamber may comprise a first ion source chamber, with the ion implantation system comprising a second ion source chamber, configured to receive precursor dispensed from the supply and to operate in a same operational manner as the first ion source chamber but offset in operation so that the second ion source chamber is operated in the first phase of operation while the first ion source chamber is operated in the second phase of operation, and so that the second ion source chamber is operated in the second phase of operation while the first ion source chamber is operated in the first phase of operation.

As previously described, the system thus may be embodied with two ion sources in a same implant tool, with one in a deposit accumulation mode, and the other generating vapors comprising dimers or tetramers, or alternatively the monitoring and control system could be utilized with two or more separate implant tools, so that a selected one or ones thereof are in the first phase of operation, while other one or ones thereof are in the second phase of operation, e.g., in a cyclic repetitive and alternating fashion, in which each of the ion sources undergoes successive first and second phases of operation.

Such sequential accumulation/implantation operation thus affords the advantages of use of solid elemental phosphorus or solid elemental arsenic, without the requirement of modification of the ion implantation system or of changing conventionally utilized dopant precursor materials.

The foregoing ion implantation system operation can be carried out in the case of phosphorus implantation with phosphorus trifluoride and/or phosphorus pentafluoride being used with or in place of phosphine for reaction with the accumulated solid elemental phosphorus to generate the desired dimers or tetramers for implantation. Likewise, in the case of arsenic implantation, the corresponding arsenic fluorocompounds can be used with or in place of arsine as the gaseous arsenic-containing material for reaction with the accumulated solid elemental arsenic.

It therefore will be appreciated that the various aspects and embodiments of the present disclosure enable substantial improvements to be achieved in phosphorus and arsenic ion implantation.

While the disclosure has been set forth herein in reference to specific aspects, features and illustrative embodiments, it will be appreciated that the utility of the disclosure is not thus limited, but rather extends to and encompasses numerous other variations, modifications and alternative embodiments, as will suggest themselves to those of ordinary skill in the field of the present disclosure, based on the description herein. Correspondingly, the disclosure as hereinafter claimed is intended to be broadly construed and interpreted, as including all such variations, modifications and alternative embodiments, within its spirit and scope.

What is claimed is:

1. An ion implantation system, comprising:
an ion implanter comprising an ion source chamber; and
a reactor configured to receive gaseous phosphorus or arsenic dopant precursor material and form gaseous polyatomic phosphorus or gaseous polyatomic arsenic therefrom, wherein the reactor is constituted in or coupled in fluid communication with flow circuitry arranged to deliver gas phase material to the ion source chamber for ionization therein to form implant species for implantation in a substrate in the ion implanter, wherein the reactor is further configured to receive dopant precursor material and to decompose that precursor material to form solid arsenic or solid phosphorus in an accumulation mode within the reactor and, after a predetermined amount of solid elemental arsenic or phosphorus is accumulated, then to vaporize the solid elemental arsenic or phosphorus to yield gaseous arsenic or phosphorus in a polyatomic form.

2. The ion implantation system of claim 1, further comprising a supply of gaseous phosphorus or arsenic dopant precursor material, wherein the system is arranged to dispense the supply to the flow circuitry.

3. The ion implantation system of claim 2, wherein the supply of gaseous phosphorus or arsenic dopant precursor material comprises a supply of gaseous phosphorus dopant precursor material.

4. The ion implantation system of claim 2, wherein the supply of gaseous phosphorus or arsenic dopant precursor material comprises a supply of gaseous arsenic dopant precursor material.

5. The ion implantation system of claim 1, wherein the reactor contains internal media or components for enhanced heat transfer and/or residence time adjustment of gaseous material flowed therethrough.

6. The ion implantation system of claim 1, wherein the reactor is constituted by a portion of the flow circuitry.

7. The ion implantation system of claim 1, further comprising a heater configured to heat the flow circuitry to a temperature above condensation temperature of gas phase tetramer species therein.

8. The ion implantation system of claim 1, further comprising a heat transfer member arranged to transfer heat from the ion source chamber to the flow circuitry.

9. The ion implantation system of claim 1, further comprising a monitoring and control assembly configured to monitor beam current or a process condition affecting beam current, and to responsively modulate one or more of flow rate, temperature, and pressure in the system, to provide a predetermined beam current.

10. The ion implantation system of claim 1, wherein the reactor is configured to produce gaseous polyatomic phosphorus or gaseous polyatomic arsenic in the form of gaseous dimer or gaseous tetramer phosphorus, or gaseous dimer or gaseous tetramer arsenic.

11. The ion implantation system of claim 1, wherein the reactor is configured to decompose a phosphorus hydride or arsenic hydride dopant precursor material, to form corresponding solid elemental phosphorus or arsenic, and hydrogen, to produce gaseous polyatomic phosphorus or gaseous polyatomic arsenic as a gas phase dimer or tetramer material.

12. The ion implantation system of claim 1, wherein the reactor has a layer of deposited and accumulated solid polyatomic phosphorus or arsenic.

13. The ion implantation system of claim 1, wherein the reactor forms part of a means for receiving dopant precursor material and decomposing the precursor material to form solid arsenic or solid phosphorus in an accumulation mode within the reactor and, after a predetermined amount of solid elemental arsenic or phosphorus is accumulated, for vaporizing the solid elemental arsenic or phosphorus to yield gaseous arsenic or phosphorus in a polyatomic form.

14. An ion implantation system, comprising:
an ion implanter comprising an ion source chamber;
a supply of a phosphorus-comprising or arsenic-comprising gas phase precursor, wherein the supply is configured to dispense the precursor to the ion source chamber;
a monitoring and control assembly configured and programmed to operate the ion source chamber in a first phase of operation under conditions that deposit and accumulate solid polyatomic phosphorus or arsenic in the ion source chamber deriving from the precursor dispensed to the ion source chamber from said supply, and in a second phase of operation under conditions that generate vapors comprising dimers or tetramers from the deposited solid polyatomic phosphorus or arsenic for ion implantation.

15. The ion implantation system of claim 14, wherein the ion source chamber comprises a first ion source chamber, and the ion implantation system comprises a second ion source chamber, configured to receive precursor dispensed from the supply and to operate in a same operational manner as the first ion source chamber but offset in operation so that the second ion source chamber is operated in the first phase of operation while the first ion source chamber is operated in the second phase of operation, and so that the second ion source chamber is operated in the second phase of operation while the first ion source chamber is operated in the first phase of operation.

16. The ion implantation system of claim 14, wherein the supply of phosphorus-comprising or arsenic-comprising gas phase precursor comprise a supply of phosphorus-comprising gas phase precursor.

17. The ion implantation system of claim 14, wherein the supply of phosphorus-comprising or arsenic-comprising gas phase precursor comprise a supply of arsenic-comprising gas phase precursor.

18. An ion implantation system, comprising:
an ion implanter comprising an ion source chamber;
a dopant source material supply assembly comprising one or more source vessels containing gaseous phosphorus or arsenic precursor compound, and configured to dispense the precursor compound for use in the ion implanter; and
a conversion assembly configured to convert dispensed gaseous phosphorus or arsenic precursor compound to gaseous polyatomic elemental phosphorus or arsenic material, and to provide the gaseous polyatomic elemental phosphorus or arsenic material for use in the ion source chamber to generate phosphorus or arsenic implantation species therefrom, wherein the conversion assembly comprises a monitoring and control assembly configured and programmed to operate the ion source chamber, in a first phase of operation, under conditions that deposit and accumulate solid polyatomic phosphorus or arsenic in the ion source chamber deriving from the precursor compound dispensed to the ion source chamber from said supply assembly and, in a second phase of operation, under conditions that generate vapors comprising dimers or tetramers from the deposited solid polyatomic phosphorus or arsenic for ion implantation.

19. The ion implantation system of claim 18, wherein the conversion assembly comprises a reactor for thermally converting the dispensed gaseous phosphorus or arsenic precursor compound to the gaseous polyatomic elemental phosphorus or arsenic material.

* * * * *